US012811441B2

(12) United States Patent
Holis et al.

(10) Patent No.: US 12,811,441 B2
(45) Date of Patent: Nov. 24, 2026

(54) Q-FACTOR CONTINUOUS EXCITATION METHOD AND APPARATUS

(71) Applicant: NXP B.V., Eindhoven (NL)

(72) Inventors: Radek Holis, Karolinka (CZ); Petr Smejkal, Valasske Mezirici (CZ); Ivan Sieklik, Martin (SK)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/826,066

(22) Filed: Sep. 5, 2024

(65) Prior Publication Data

US 2026/0066710 A1 Mar. 5, 2026

(51) Int. Cl.
*H02J 50/60* (2016.01)
*G01R 27/26* (2006.01)
*H02J 50/12* (2016.01)

(52) U.S. Cl.
CPC .......... *H02J 50/60* (2016.02); *G01R 27/2688* (2013.01); *H02J 50/12* (2016.02)

(58) Field of Classification Search
CPC ........ H02J 50/12; H02J 50/60; G01R 27/2688
See application file for complete search history.

(56) References Cited

U.S. PATENT DOCUMENTS 10,199,881 B2 2/2019 Muratov et al.
10,218,211 B2 2/2019 Li et al.
10,804,750 B2 10/2020 Liu et al.
10,833,540 B2 11/2020 Chen et al.
11,108,324 B1 8/2021 Vaculik et al.
11,336,118 B2 5/2022 Jiang et al.
11,509,171 B2 11/2022 Vaculik et al.
11,824,376 B1 11/2023 Holis et al.
11,990,781 B2 5/2024 Wang et al.
2017/0117755 A1* 4/2017 Muratov ................ H02J 50/12
2019/0109499 A1 4/2019 Smith et al.
(Continued)

FOREIGN PATENT DOCUMENTS

EP 3160008 A1 4/2017

OTHER PUBLICATIONS

U.S. Appl. No. 18/826,068, “Method and Apparatus for Q-Factor Detection With Reduced Core Interaction,” filed Sep. 5, 2024.
(Continued)

*Primary Examiner* — Rexford N Barnie
*Assistant Examiner* — Joseph N Inge

(57) ABSTRACT

A method is provided for operating a wireless charger having a multi-switch inverter which supplies an output PWM signal to a resonant circuit in response to switching control signals, including a first set of continuous excitation phase switching control signals (which generate the output PWM signal to have alternating positive and negative pulses having a first pulse frequency) and a second set of free resonance signal sensing phase switching control signals (which enable the resonant tank circuit to generate a resonant decaying output voltage signal in the presence of a foreign object that is located near the wireless charger), where each continuous excitation phase switching control signal includes a plurality of positive or negative excitation pulses having the first pulse frequency, and where one or more quality factor parameters of the wireless charger are measured based on one or more electrical parameters of the resonant decaying output voltage signal.

16 Claims, 8 Drawing Sheets

(56) References Cited

U.S. PATENT DOCUMENTS

| | | | | |
|---|---|---|---|---|
| 2020/0185974 | A1 | 6/2020 | Chen et al. | |
| 2022/0123591 | A1 | 4/2022 | Vaculik et al. | |
| 2023/0231420 | A1* | 7/2023 | Bhandarkar ............. | H04B 5/48<br>307/104 |

OTHER PUBLICATIONS

Wireless Power Consortium, "Qi Specification Foreign Object Detection," Version 1.3, Jan. 2021, 34 pages.
Non-Final Office Action for U.S. Appl. No. 18/826,068, mailed May 14, 2026, 37 pages.
Notice of Allowance for U.S. Appl. No. 18/826,068 mailed Aug. 11, 2026, 18 pages.

* cited by examiner

7

Q-FACTOR CONTINUOUS EXCITATION METHOD AND APPARATUS

BACKGROUND

Field

The present disclosure is directed in general to the field of wireless power transmission. In one aspect, the present disclosure relates to a method and apparatus for detecting a quality factor (Q-factor) of a wireless charger.

Description of the Related Art

Wireless power charging devices use inductive charging to wirelessly transmit power by applying a current or voltage to a transmitter coil in response to detecting that a device to be charged is within a predetermined range of the wireless charging device. One of the challenges with wireless power charging devices is detecting objects that are present in the charging area to determine if they are a device that is to be charged or a foreign object (like a metal object) that can create a hazard by absorbing power to heat up and/or catch fire. Foreign object detection can use external sensors, circuitry and software which add cost to the overall system. Another detection technique is to evaluate an electrical parameter called the quality factor (or Q-Factor) associated with the performance of an electromagnetic coil. An existing approach for measuring the free resonance Q-factor is to inject a single excitation energy PWM pulse into the LC circuit to generate a free resonance signal with an attenuation rate, which can be calculated as the Q-factor value. Because this technique does not require external hardware circuitry and has low power consumption, it is widely used in wireless charging systems for detecting metal objects. However, since the Q-factor measurement is high-resolution and sensitive, the free resonance signal for Q-factor measurement must be accurate and pure to guarantee its accuracy and stability. Unfortunately, there are instability and inaccuracy drawbacks from measuring the Q-factor by using a single excitation pulse to generate the free resonance signal. As seen from the foregoing, existing solutions for operating and controlling a wireless power charging devices are extremely difficult at a practical level by virtue of the challenges with accurately measuring the quality factor of a wireless power charging device in view of reliability and instability challenges arising from conventional excitation, sensing, and measurement processing solutions. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
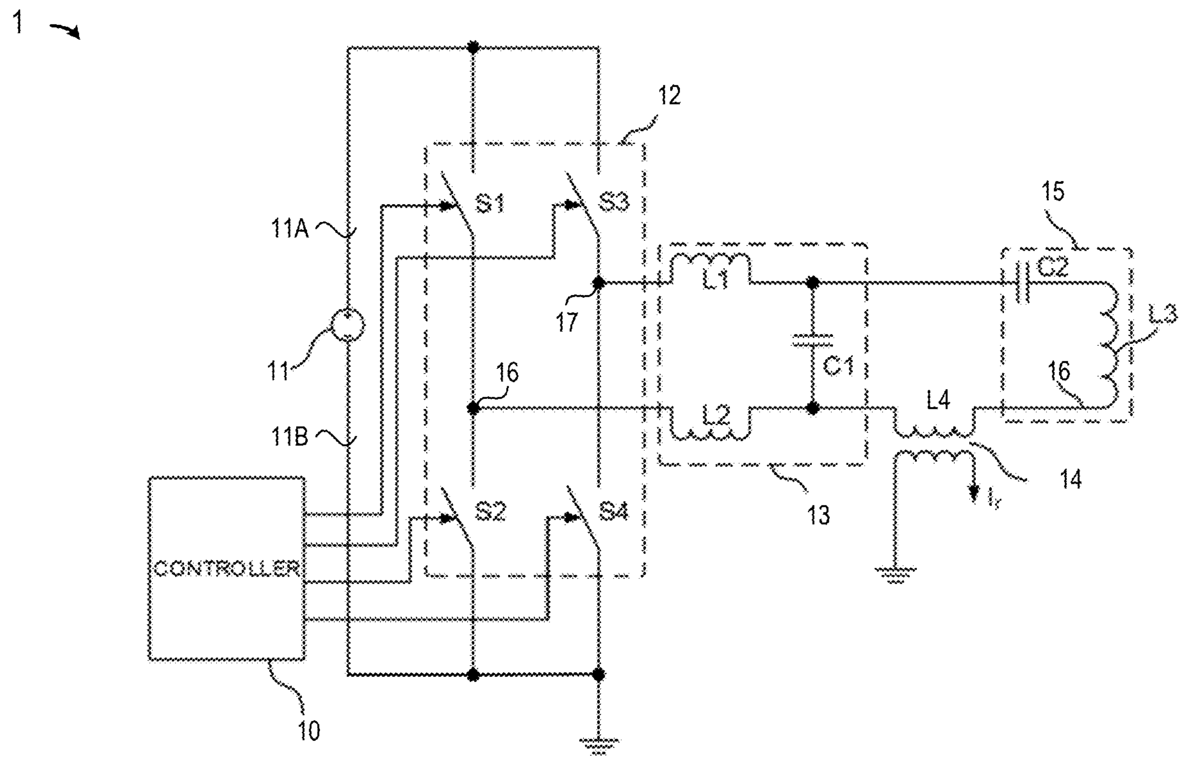
FIG. 1 depicts a schematic circuit diagram of a conventional wireless power charger which uses a single pulse excitation and sensing for calculating a resonance frequency and quality factor.

A wireless power charging device and method of operation are described for detecting a foreign object by measuring a Q-factor of transmitter coils with improved accuracy, reliability, and stability by using a predetermined excitation pulse sequence to drive a resonance circuit before performing free resonance decay signal sensing. In a first resonance frequency calculation phase, a first predetermined excitation pulse sequence may be generated as a continuous phase-shift excitation pulse sequence having a first frequency that drives the resonance circuit in order to stabilize the transmit Tx and receiver Rx circuits to steady states and to eliminate electric transients, thereby enabling the free resonance frequency to be calculated. In a second Q-factor calculation phase, a second predetermined excitation pulse sequence may be generated as a continuous phase-shift excitation pulse sequence having the measured free resonance frequency that drives the resonance circuit, thereby enabling the Q-factor to be calculated. Between the first and second phases, the rail voltage may be adjusted or lowered in order to prevent receiver wake-up during the application of the second predetermined excitation pulse sequence. In selected embodiments, the present disclosure provides a software-based solution for addressing Q-factor measurement instability in automotive hardware, such as through a firmware update and without requiring dedicated hardware. In addition, the excitation and sensing phases for measuring the Q-factor may be performed by MCU peripheral subsystems (such as the DMA unit, triggering unit, ADC unit, and PWM generator unit) without requiring MCU core resources except for configuration and post-processing operations.

In this disclosure, an improved Q-factor measurement circuit, design, structure, and method of operation are described to address various problems in the art where various limitations and disadvantages of conventional solutions and technologies will become apparent to one of skill in the art after reviewing the remainder of the present application with reference to the drawings and detailed description provided herein. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified schematic circuit and block diagram drawings without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. Further, reference numerals have been repeated among the drawings to represent corresponding or analogous elements.

For an improved understanding of selected embodiments of the present disclosure, reference is now made to FIG. 1 which depicts a schematic circuit diagram of a conventional wireless power charger 1 which uses a single pulse excitation and sensing for calculating a resonance frequency and quality factor. The depicted wireless power charger 1 includes a controller 10, a voltage supply 11, a power inverter 12, a filter 13, a current sensor 14, and a resonant tank circuit 15.

The voltage supply 11 provides a first supply voltage (e.g., Vdd) at a first output terminal 11A and a second supply voltage (e.g., Vss) at a second output terminal 11B. The power inverter 12 converts the supply voltages into an AC signal, and provides the AC signal to the resonant tank 15. As depicted, the power inverter 12 is a full-bridge type inverter which includes a first branch S1, S2 and a second branch S3, S4 which are connected in parallel between the first and second output terminals 11A, 11B. More particularly, the first branch S1, S2 includes series-connected switches S1 and S2, where a first terminal of the first switch S1 receives the first supply voltage from the output terminal 11A and a terminal of the second switch S2 is connected to ground. The second branch S3, S4 includes series-connected switches S3 and S4, where a first terminal of the third switch S3 receives the FIRST supply voltage from the output terminal 11A and a terminal of the fourth switch S4 is connected to ground. The power inverter 12 has a first output terminal 16 and a second output terminal 17 that provide the converted AC signal to the resonance tank 15. The first output terminal 16 is connected to a node between the first and second switches S1 and S2, and the second output terminal 17 is connected to a node between the third and fourth switches S3 and S4.

The filter unit 13 is connected to the power inverter 12 to receive the AC signal via the first and second output terminals 16, 17. The filter 13 filters the AC signal and generates a filtered PWM (pulse-width modulated) signal. In selected embodiments, the filter 13 may be a pi-filter (π-filter) which includes first and second inductors L1 and L2, and a capacitor C1. The first inductor L1 is connected to the second output terminal 17 of the power inverter 12, and the second inductor L2 is connected to the first output terminal 16 of the power inverter 12. The first inductor L1 has a first terminal connected to the second output terminal 17, and has a second terminal connected to the resonant tank circuit 15 and to a first terminal of the capacitor C1. Similarly, the second inductor L2 has a first terminal connected to the first output terminal 16, and has a second terminal connected to the resonant tank circuit 15 and to a second terminal of the capacitor C1. Thus, the capacitor C1 is connected between the second terminal of the first inductor L1 and the second terminal of the second inductor L2. The filter unit 13 filters out harmonic components from the square-wave AC signal from the power inverter 12 to produce a sinusoid-wave PWM signal, and provides the filtered sinewave PWM signal to the resonant tank circuit 15. In alternative embodiments, the filter unit 13 can include more or fewer inductors.

Figure 2:
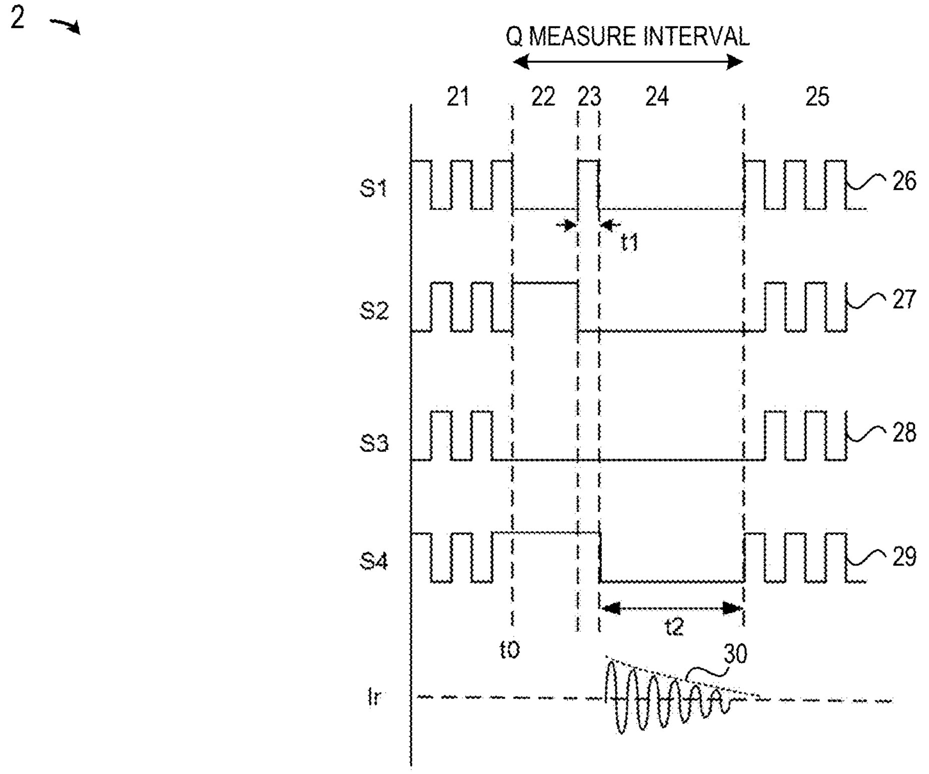
FIG. 2 depicts a timing diagram of the switching control signals provided to a wireless power charger when using a single pulse excitation for sensing and calculating a resonance frequency and quality factor.

The resonant tank circuit 15 is connected to the power inverter 12 to receive the AC signal. To be more specific, the resonant tank circuit 15 is connected to the first output terminal 16 and the second output terminal 17 to receive the AC signal. The resonant tank circuit 15 includes a series-connected capacitor C2 and inductor coil L3 which radiates power. As shown in FIG. 2 with the timing diagrams 2 of the switching control signals S1-S4 26-29, the wireless power charger has a normal operation charging phase 21 where the first branch switches S1 and S2 are controlled by the controller 10 to be alternately opened and closed, and where the second branch switches S3 and S4 are controlled by the controller 10 to be alternately closed and opened. During the charging phase 21, the switches S1, S4 are simultaneously turned ON while the switches S2, S3 are simultaneously turned OFF during a first pulse, and then during the next pulse, the switches S1, S4 are simultaneously turned OFF while the switches S2, S3 are simultaneously turned ON. In addition, the switches S1 and S2, or the switches S3 and S4, are not closed simultaneously to avoid shorting the voltage supply 11.

To measure the quality factor, the switching control signals S1-S4 26-29 supplied to the wireless power charger enter a discharge phase 22 where the output terminals 16, 17 are disconnected from the first supply voltage (e.g., turn OFF the switches S1, S3), and where the output terminals 16, 17 are connected to the second supply voltage (e.g., turn ON the switches S2, S4). Subsequently, the switching control signals S1-S4 26-29 enter an excitation pulse phase 23 where the switches S1, S4 are turned ON to excite the circuit during a first time period t1. Subsequently, the switching control signals S1-S4 26-29 enter a Q-factor measurement phase 24 where the switches S1 and S3-S4 are turned OFF and the switch S2 is turned OFF during a second time period t2. During the Q-factor measurement phase 24, the LC oscillation generated at the output terminals 16, 17 goes through the filter 13 and resonant tank circuit 15 which generates the resonance waveform 30 having the resonant current $I_r$ which may be measured by the current sensor 14. In this configuration, the switch S2 is turned ON to be able to measure Q-factor using the current sensor 14 and to prevent floating. And by turning OFF the switches S1 and S3-S4 during the Q-factor measurement phase 24, the current flow cannot go through the inductors L1, L2 because there is no current loop after some time, so the resonance network consists of C1, C2, L3, and L4. Based on the measured resonant current $I_r$ from the resonance waveform 30, the Q factor can be calculated to determine if a foreign object is present or if a device to be charged is detected. Upon detecting a device to be charged is in proximity to the wireless power charger 1, then the controller 10 generates the switching control signals S1-S4 26-29 to enter another normal operation charging phase 25.

Unfortunately, there are performance limitations from conventional wireless power chargers which measure the Q-factor from a resonance waveform that is generated using a single excitation pulse, including, but not limited to instability and inaccuracy of the Q-factor measurements. And while hardware-based Q-factor sensors could be developed, such solutions add cost and complexity to the wireless power transmission systems, and in any event are not suitable for existing wireless power transmitters. Due to their circuit complexity, conventional wireless power chargers also require a transition state from the enforced oscillation frequency phase (e.g., 21) to the free resonance frequency phase (e.g., 24) which can adversely affect charging operations since the measurement of the Q-factor signal during the transition state can be disturbed by parasitic properties of the charging hardware when using a single excitation pulse. Another challenge with conventional wireless power chargers is that the gain of such circuits can be very high when operating under a resonant frequency, and this can result in the sensing circuit being saturated if supplied with a voltage that is too high.

As seen from the foregoing, there are conflicts and tradeoffs between providing wireless power charger which can accurately and efficiently make quality factor measurements for determining if an unfriendly foreign object (i.e., a metal object) is present in a charging area. To address the foregoing deficiencies and others known to those skilled in the art, there is disclosed herein a wireless power charging device and method of operation for accurately measuring a Q-factor with improved accuracy, reliability, and stability by using a predetermined excitation pulse sequence to drive a resonance circuit before performing free resonance decay signal sensing.

Figure 3:
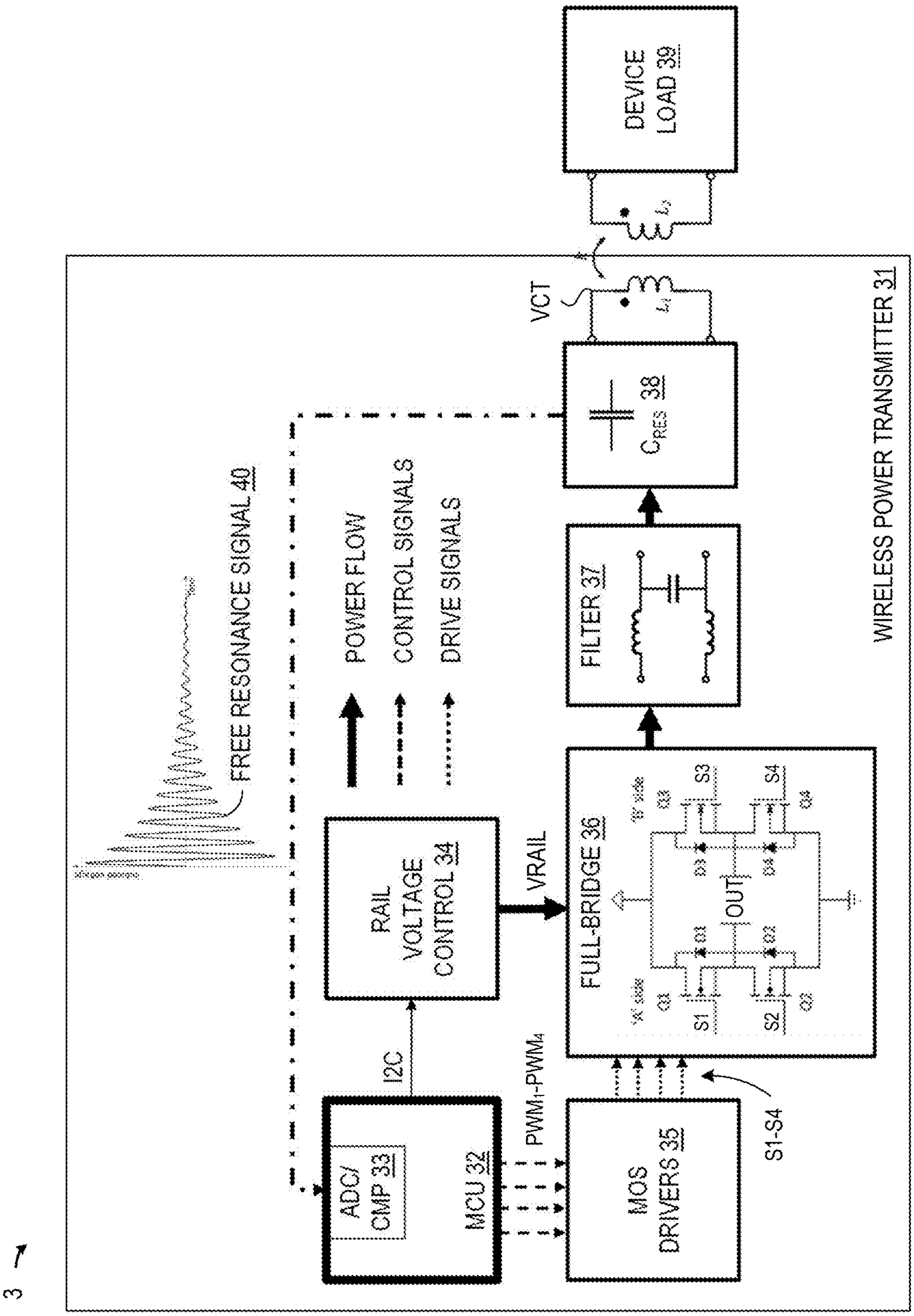
FIG. 3 depicts a high-level electrical circuit schematic of a wireless power charging system in accordance with selected embodiments of the present disclosure.

To provide an improved understanding of selected embodiments of the present disclosure, reference is now made to FIG. 3 which depicts a high-level electrical circuit schematic 3 of a wireless power charging system. The wireless power charging system may include a wireless power transmitter 31 coupled over transmitter and receiver inductor coils L1, L2 to a device load 39, such as a handheld wireless phone, a wearable device (e.g., watch, glasses, fitness tracker, sleeping monitor), or other type of electronic device. In some examples, the device load 39 and the receiver inductor coils L2 may form an integrated device. The wireless power transmitter 31, transmitter and receiver inductor coils L1, L2, and device load 39 may be each implemented using circuitry, such as one or more of analog circuitry, mix signal circuitry, memory circuitry, logic circuitry, and processing circuitry that executes code stored in a memory that when executed by the processing circuitry perform the disclosed functions, among other implementations.

In an example implementation, the wireless power transmitter 31 may include a microcontroller unit (MCU) 32 which includes one or more cores, ADC-comparator (CMP) unit 33, rail voltage control unit 34, MOS drivers unit 35, full-bridge power converter 36, filter unit 37, and resonance circuit 38 which are connected to generate a free resonance signal 40 that is fed back to the MCU 32 for processing to calculate the quality factor. As disclosed, the MCU 32 is configured to generate four pulse width modulated signals $PWM_1$-$PWM_4$ that are supplied to a MOSFET drivers unit 35. In turn, the MOS drivers unit 35 may be configured as a line stage or a power amplifier to generate a stable current switching control signals S1-S4 for input to the full-bridge power converter 36. Though not shown, there may be an external current supply connected to the MOS drivers unit 35 to supply the current switching control signals S1-S4.

The rail voltage control unit 34 is also connected to the full-bridge power converter 36 to generate and control one or more DC voltages that are provided as supply reference voltages to the full-bridge power converter 36. As disclose herein, the rail voltage control unit 34 may be configured to adjust or lower the rail voltage between the excitation and sensing phases in order to prevent receiver wake-up during the application of the second predetermined excitation pulse sequence. In an example, the rail voltage control unit 34 may be a configurable DC/DC converter which the MCU 32 controls with an I2C control signal.

The depicted full-bridge power converter 36 includes one or more power switches Q1-Q4 which may be implemented as switching metal-oxide semiconductor field effect transistors (MOSFETs) that are arranged in a full-bridge configuration (as shown), a half bridge configuration, or other suitable configuration. The power switches Q1, Q3 are connected to receive the switching control signals S1, S3 and may be coupled to a first reference supply voltage (e.g., Vdd). In addition, the power switches Q2, Q4 are connected to receive the switching control signals S2, S4 and may be coupled to a second reference supply voltage (e.g., ground). In this arrangement, the full-bridge power converter 36, during normal charging operation, converts the variable DC voltage VRAIL from the rail voltage control 34 to the square wave 50% duty-cycle high frequency voltage with a predetermined frequency range (e.g., 105 kHz to 115 kHz).

At the filter unit 37, the output power signal (OUT) from the full-bridge power converter 36 is filtered with an inductive-capacitive power filter or other suitable filter to provide a filtered power output to the resonance circuit 38. In selected embodiments, the filter unit 37 may be a "pi" filter which includes a pair of inductors and a parallel capacitor connected to filter out higher order harmonics resulting from the switching.

As depicted, the resonance circuit 38 may include a resonant capacitor CRES and a transmitter inductor coil L1 to generate a coil current at an operating frequency of the wireless power transmitter 31. The transmitter coil L1 may be located on a charging surface such that current flowing through the transmitter coil L1 or voltage applied across the transmitter coil L1 causes the transmitter coil L1 to transmit a power signal. The charging surface may be a planar pad on which the power receiving device may be placed to charge a battery of the device load 39.

In operation, the full-bridge power converter 36 receives DC power from the rail voltage control 34 and also receives the switching control signals S1-S4 generated by the MCU 32 and MOS drivers unit 35. The full-bridge power converter 36 then applies the switching control signals S1-S4 to the gate terminals of the switches Q1-Q4 to produce a rough sine wave or other output power signal (OUT) which is filtered by the filter unit 37 before being supplied to the resonance circuit 38 for wirelessly transmitting power to the device load 39. The MCU 32 may vary the signals $PWM_1$-

$PWM_4$ (and therefore the switching control signals S1-S4) according to a predetermined and configurable programming sequence.

In accordance with the present disclosure, the MCU 32 may generate the switching control signal programming sequence to include a first discharge time sequence whereby the switching control signals S1, S3 turn OFF the switches Q1, Q3, and the switching control signals S2, S4 turn ON the switches Q2, Q4. In addition, the MCU 32 may generate the switching control signal programming sequence to include a continuous excitation phase wherein the switching control signals S1-S4 include non-overlapping phase-shifted pulses having a configurable period in the switching control signals S1, S3, and also include symmetric, complementary phase-shifted pulses having the same configurable period in the switching control signals S2, S4 to drive the switches Q1-Q4 before performing free resonance decay signal sensing. Stated another way, the switching control signals S1, S2 are complementary to one another so that each "high" pulse in the switching control signal S1 coincides with a "low" pulse in the switching control signal S2, and the switching control signals S3, S4 are also complementary to one another, but phase-shifted from the timing of the switching control signals S1, S2 during the continuous excitation phase. Finally, the MCU 32 may generate the switching control signal programming sequence to include a free resonance signal sensing phase wherein the switching control signals S1-S4 turn OFF the switches Q1, Q3, Q4 and turn ON the switch Q2 to perform free resonance decay signal sensing.

Figure 4:
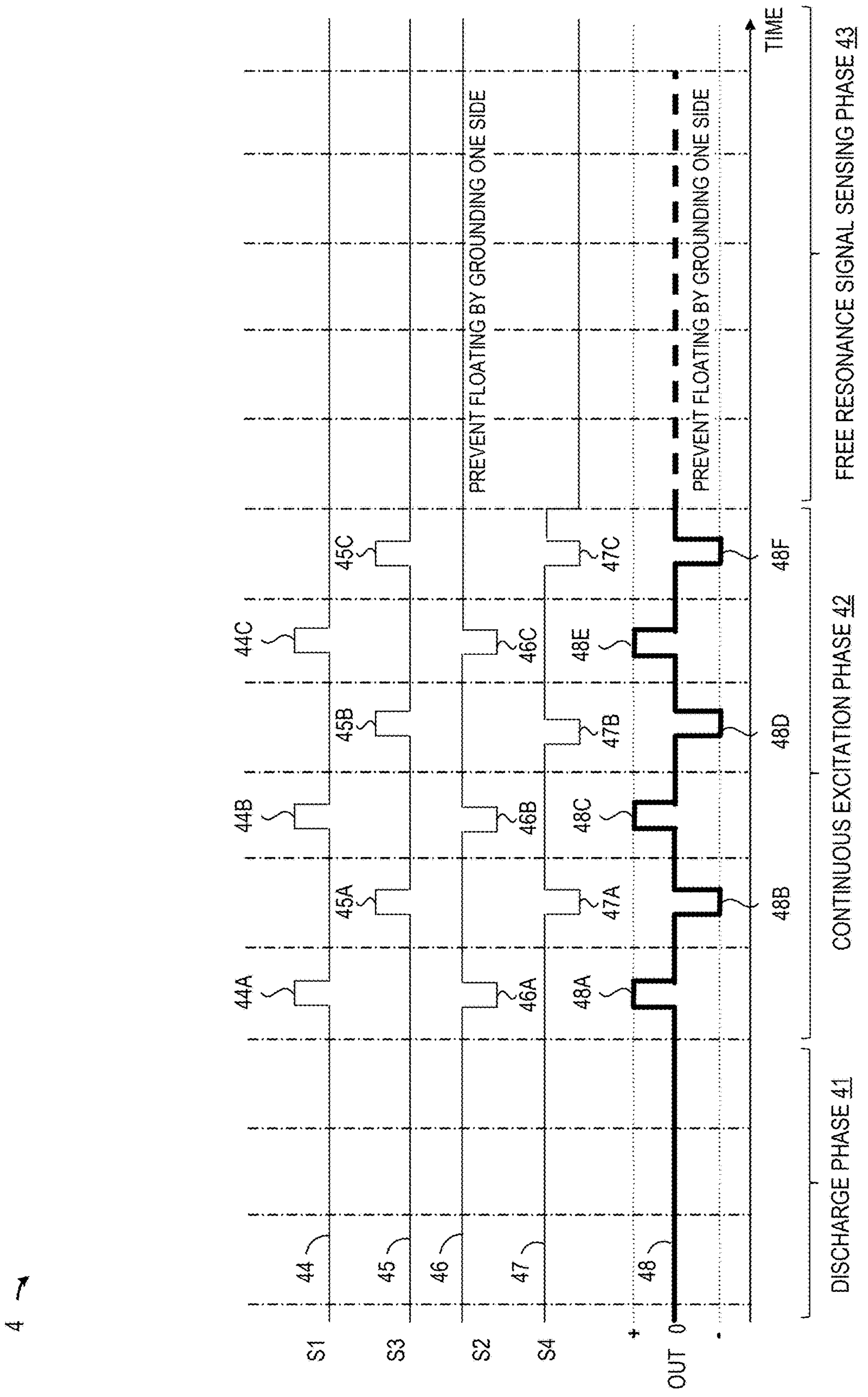
FIG. 4 depicts a timing diagram of the switching control signals provided to a wireless power charger which uses continuous excitation for sensing and calculating a resonance frequency and quality factor in accordance with selected embodiments of the present disclosure.

To provide an improved understanding of selected embodiments of the present disclosure, reference is now made to FIG. 4 which depicts a timing diagram 4 of the switching control signals S1-S4 44-47 provided to a power inverter (such as the full-bridge power converter 36 shown in FIG. 3) and the output signal 48 of the power inverter of a wireless power charger which uses continuous excitation for sensing and calculating a resonance frequency and quality factor. As depicted, the switching control signals S1-S4 44-47 have a discharge phase 41, a continuous excitation phase 42, and a free resonance signal sensing phase 43 which are applied to accurately measure the quality factor value for reliable detection of a foreign object in the vicinity of the wireless power charger. The output signal 48 shows the output power signal (OUT) generated by the power inverter and provided to the filter and resonance circuit.

In the discharge phase 41, the switching signal S1 44 and S3 45 turn OFF the switches Q1, Q3 to disconnect the terminals for the output power signal (OUT) from the first supply voltage (e.g., Vdd). In addition, the switching signals S2 46 and S4 47 turn ON the switches Q2, Q4 to connect the terminals for the output power signal (OUT) to the second supply voltage (e.g., Vss). As a result, the terminals for the output power signal (OUT) are discharged to ground, thereby discharging the power inverter into a stable starting condition before beginning the continuous excitation phase 42. The duration of the discharge phase 41 can be configured to last several time periods so that the power inverter has the same initial condition whenever Q-factor measurement begins.

In the continuous excitation phase 42, the switching control signals S1 (44), S3 (45) include non-overlapping phase-shifted positive pulses 44A-C, 45A-C having a configurable period. In addition, the switching control signals S2 (46), S4 (47) include symmetric, complementary phase-shifted pulses 46A-C, 47A-C having the same configurable period. In this way, the phase-shifted positive pulses 44A-C, 45A-C in the switching control signals S1 (44), S3 (45) alternately connect the first and second terminals of the output power signal (OUT) to the first supply voltage (e.g., Vdd) while the symmetric, complementary phase-shifted pulses 46A-C, 47A-C alternately disconnect the first and second terminals of the output power signal (OUT) from the second supply voltage (e.g., Vss). As depicted, the switching control signals S1, S2 are complementary to one another so that each "high" pulse (e.g., 44A) in the switching control signal S1 coincides with a "low" pulse (e.g., 46A) in the switching control signal S2, and the switching control signals S3, S4 are also complementary to one another, but phase-shifted from the timing of the switching control signals S1, S2 during the continuous excitation phase. As disclosed herein, the switching control signals S1-S4 44-47 have a configurable period or frequency which may be controlled by the MCU to be adjusted as needed. In selected embodiments, the configurable period may be in the range of 50-300 us which corresponds to an excitation frequency of 127 kHz (or period of 8 μs) for a number of pulses in the range of 6-32. In addition, the number of positive and negative phase-shifted pulses 44A-C, 45A-C, 46A-C, 47A-C may be configured and adjusted to include additional or fewer pulses during the continuous excitation phase 42. For example, the duration of the continuous excitation phase 42 can be configured to last 10-30 time periods which provides a balance between timing and stability performance considerations.

Another control feature of the continuous excitation phase 42 is balancing the tradeoffs on the pulse width of the switching control signals S1-S4 44-47. If the pulse widths are too wide or long, the power inverter will generate too much output power and saturate the sensing circuit or wake up the power receiver. This can even happen when the rail voltage is reduced if the pulse width is too large. On the other hand, if the pulse widths are too narrow or short, the pulses will not propagate correctly to power inverter output when the propagation delays and on-time value (mosfets/drivers) is close to the pulse width time. In selected embodiments, these design tradeoffs may be balanced by controlling the pulse width value to be between 2-10% of the period. In selected embodiments, a 2% pulse width value is the minimum value that the switches can handle, and a 10% pulse width value is the maximum value that can be supplied using the minimum rail voltage value without saturating the sensing circuit. However, it will be appreciated that the range of suitable pulse width value will be depending on the circuit hardware.

In the free resonance signal sensing phase 43, the switching control signals S1 (44), S3 (45), and S4 (47) turn OFF the switches Q1, Q3, Q4, and the switching control signal S2 (46) turns ON the switch Q2 to connect the second terminal of the output power signal (OUT) to ground so that the resonant network can resonate. In this switching configuration with the switch Q2 turned ON, a voltage or current sensor can measure the free resonance signal. For example and as shown in FIG. 3, a voltage sensor may measure the transmitter resonance circuit voltage (VCT) which is between the resonance circuit 38 and the transmitter inductor coil L1, though the free resonance signal voltage or current may be measured at any suitable voltage/current point within the circuit where free resonance is visible and sensitive to foreign object presence.

After the free resonance signal sensing phase 43, the measured free resonance signal may be processed by a controller core to calculate the Q-factor measure which is used to determine if a foreign object is present or if a device to be charged is detected. Typically, the Q-factor quantifies the damping rate of energy stored in the resonant tank circuit due to the internal energy loss of the resonant tank circuit. If a foreign object is present, the stored energy by the resonant tank circuit fluctuates, and accordingly the Q-factor becomes different as compared to the absence of the foreign object. In accordance with the present disclosure, any suitable Q-factor measurement process may be used, such as by periodically sampling the resonant frequency and decay envelope of the free resonance signal for use in calculating the Q-factor. Upon detecting a device to be charged is in proximity to the wireless power charger, then the controller core generates the switching control signals S1-S4 to enter a charging phase (not shown).

As will be appreciated, the depicted full-bridge power converter (FIG. 3) and timing diagram 4 (FIG. 4) provide an example implementation for generating a phase shifted output signal 42 for the continuous excitation phase, but it will be appreciated that other switching control signals can be applied to the full-bridge power converter to create the free resonance signal 40 that is sensed and processed by the MCU.

Figure 5:
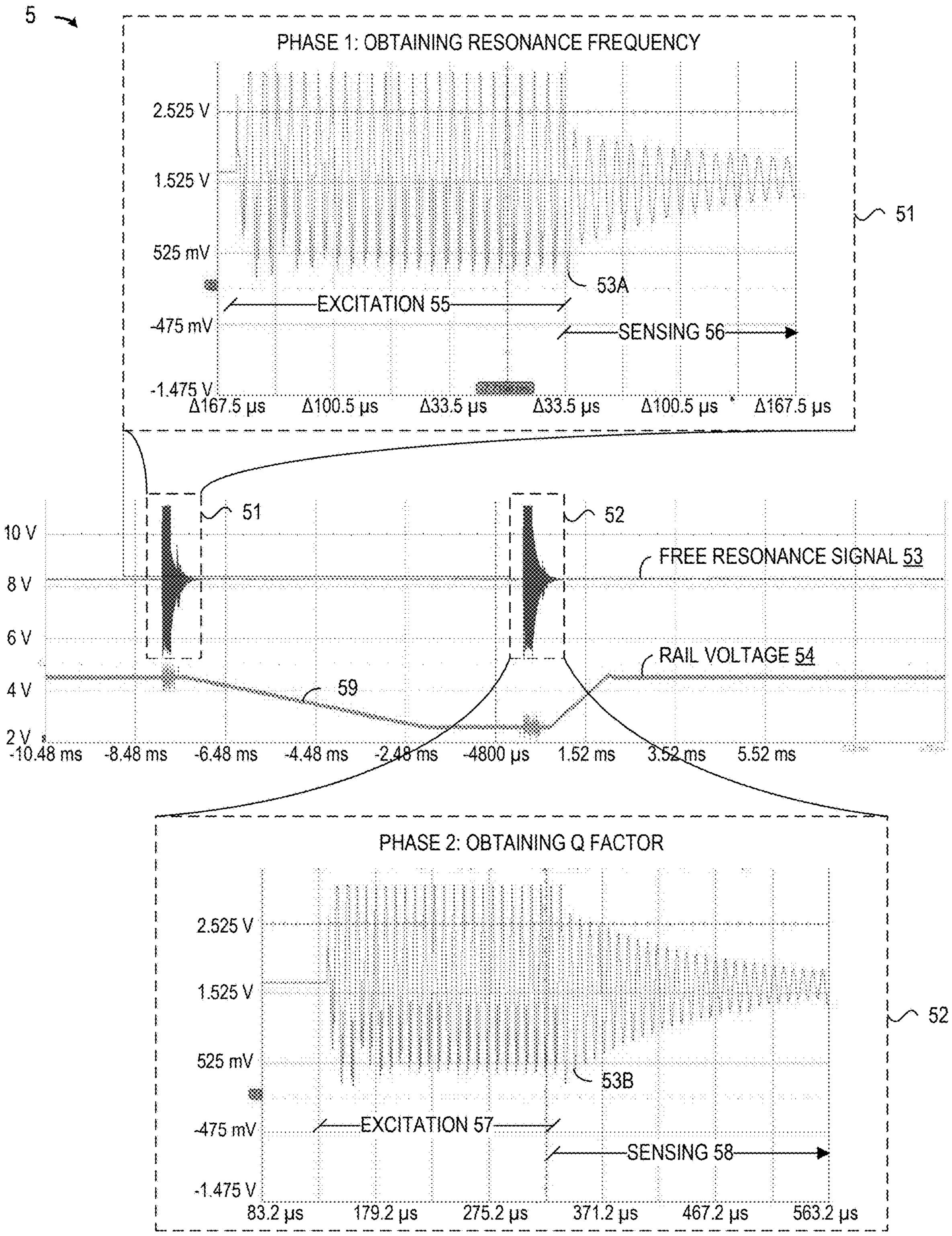
FIG. 5 depicts a timing diagram of the measured free resonance signal and rail voltage values generated by a wireless power charger which uses continuous excitation to obtain a resonance frequency and quality factor in accordance with selected embodiments of the present disclosure.

To provide an improved understanding of selected embodiments of the present disclosure, reference is now made to FIG. 5 which depicts a timing diagram 5 of the measured free resonance signal 53 and rail voltage signal 54 generated by a wireless power charger which uses continuous excitation to obtain a resonance frequency and quality factor. As depicted, the free resonance signal 53 includes two phases, a first phase 53A (Phase 1) for obtaining the resonance frequency, and a second phase 53B (Phase 2) for obtaining the Q-factor.

As illustrated with the enlarged detail 51, the first resonance waveform 53A has an excitation phase 55 which is generated by supplying a first continuous phase-shift excitation pulse sequence switching control sequence having a first fixed frequency (e.g., ~127 kHz) to the power converter. In addition, the first resonance waveform 53A has a sensing phase 56 which is generated by supplying a discharge switching control sequence to the power converter. Rather than immediately calculate the Q-factor, the sensing phase 56 is used to measure the free resonance frequency.

In similar fashion, the enlarged detail 52 depicts the second resonance waveform 53B which includes an excitation phase 57 and a sensing phase 58. The excitation phase 57 is generated by supplying a second continuous phase-shift excitation pulse sequence switching control sequence to the power converter. Depending on the placement of the receiver and/or foreign object, the second continuous phase-shift excitation pulse sequence switching control sequence has a second different frequency (e.g., ~80-120 kHz) that is the free resonance frequency measured from the first resonance waveform 53A. To sense the free resonance frequency, a controller core may employ an analog-to-digital (ADC) circuit and comparator to track zero-cross events with timestamps. In addition, the second resonance waveform 53B has a sensing phase 58 which is generated by supplying a discharge switching control sequence to the power converter. After the free resonance signal sensing phase 58, the measured free resonance signal is processed to calculate the Q-factor measure which is used to determine if a foreign object is present or if a device to be charged is detected.

After generating the first resonance waveform 53A and before generating the second resonance waveform 53B, the rail voltage signal 54 shows that the rail voltage may be adjusted in order to prevent receiver wake-up during the application of the second predetermined excitation pulse sequence. In particular and as indicated with the voltage ramp 59, the rail voltage signal 54 may be decreased prior to generating the second resonance waveform 53B for Q factor excitation. To reduce the rail voltage, a controller may send an I2C command to the rail voltage control to decrease the rail voltage by a specified amount (e.g., from 4V to 2V) over a specified time period that is controlled to be completed before the second resonance waveform 53B. In situations where the serial resonance circuit has a very low impedance and/or high gain, the reduced ramp voltage can be advantageous in preventing saturation of the resonance circuit. In addition, the reduced rail voltage prevents the receiver rectifier on a device being charged from being activated, thereby disturbing the free resonance signal.

Figure 6:
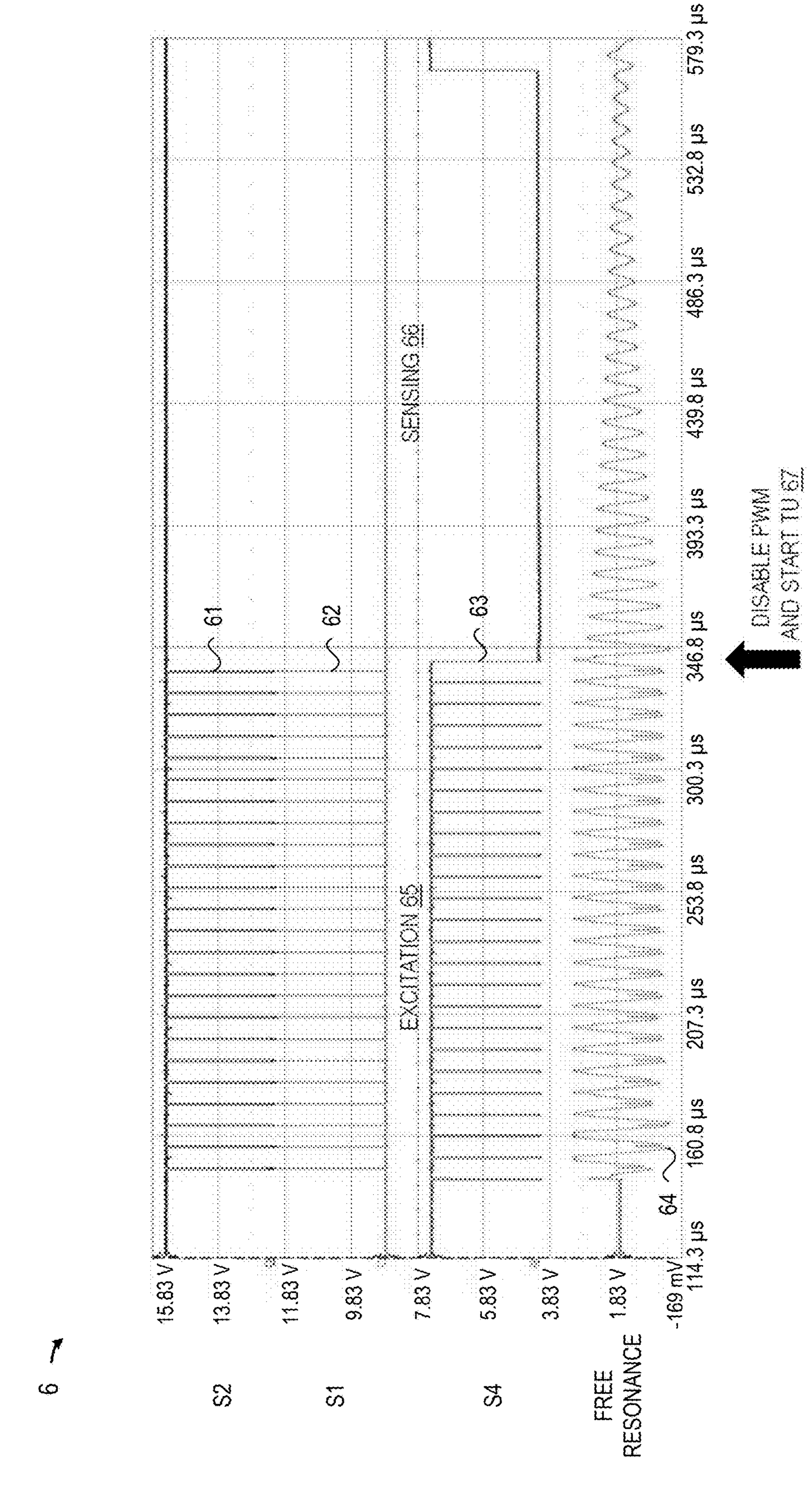
FIG. 6 depicts a detailed timing diagram for the switching control signals used during excitation and sensing phases in accordance with selected embodiments of the present disclosure.

To provide an improved understanding of selected embodiments of the present disclosure, reference is now made to FIG. 6 which depicts a detailed timing diagram 6 for the switching control signals 61-63 and resulting free resonance signal 64 during excitation phase 65 and sensing phase 66. As depicted in the excitation phase 65, the switching control signals S2 (61) and S1 (62) have a fixed frequency and are complementary to one another so that each "low" pulse in the switching control signal S2 (61) coincides with a "high" pulse in the switching control signal S1 (62). In addition, the switching control signal S4 (63) during the excitation phase 65 has the same fixed frequency as the switching control signals S2 (61), S1 (62), but has non-overlapping phase-shifted "low" pulses. As a result of the switching control signals S2 (61), S1 (62), S4 (63) in the excitation phase 65 being applied to the power inverter, the free resonance signal 64 is generated as an oscillating voltage having the fixed frequency and a uniform voltage range.

In the sensing phase 66, the switching control signal S2 (61) is held "HIGH" and the switching control signals S1 (62) and S4 (63) are held "LOW" in order to generate the free resonance signal. This may be accomplished at a transition time 67 by disabling the pulse width modulation (PWM) signal generator. As a result of the switching control signals S2 (61), S1 (62), S4 (63) in the sensing phase 66 being applied to the power inverter, the free resonance signal 64 is generated as an oscillating voltage having the fixed frequency and a decaying voltage range. In order to characterize the free resonance signal during the sensing phase, the trigger unit (TU) may be started at the transition time 67 to periodically sample the decay envelope of the free resonance signal 67. As disclosed herein, the frequency of the free resonance signal 67 is calculated during post-processing phase of the first measurement phase.

Figure 7:
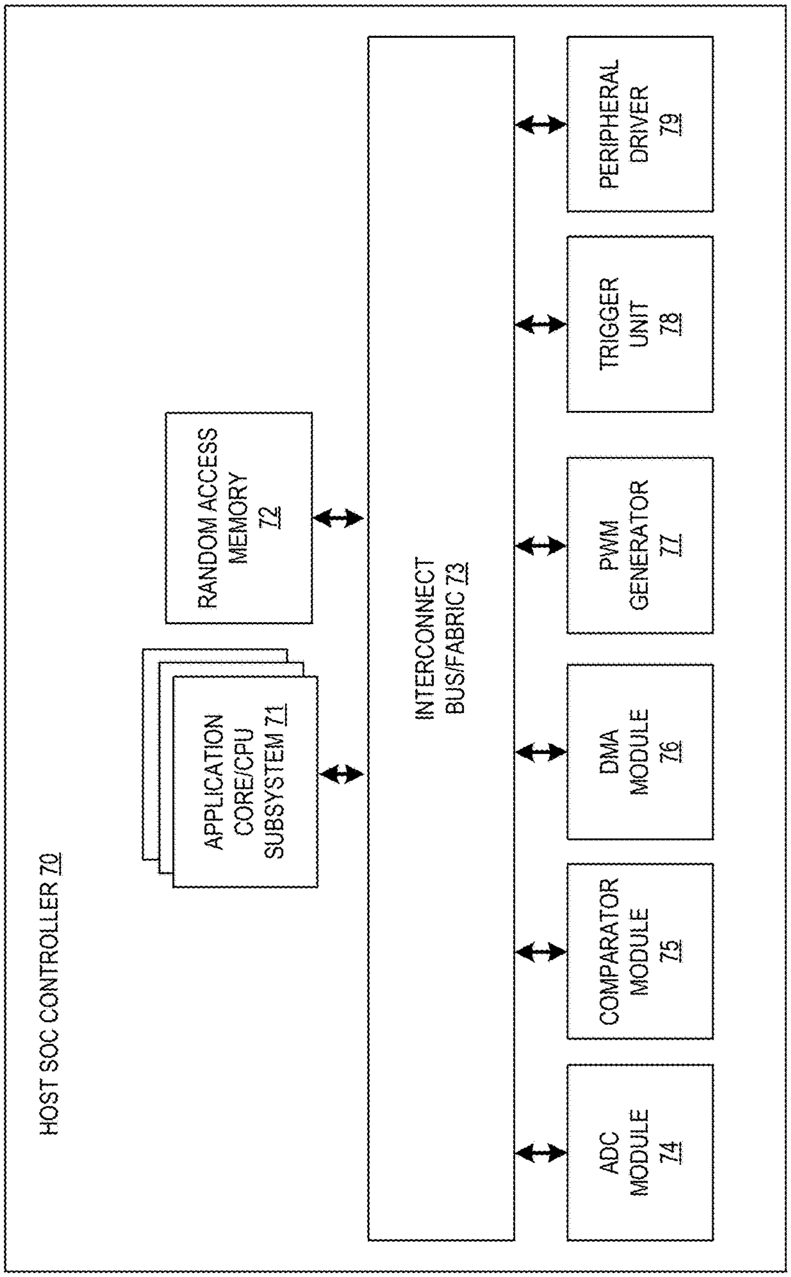
FIG. 7 depicts a simplified block diagram of a host system-on-chip (SoC) for generating a PWM switching control signals used during excitation and sensing phases in accordance with selected embodiments of the present disclosure pulse sequence.

For an improved understanding of selected embodiments of the present disclosure, reference is now made to FIG. 7 which depicts a simplified block diagram 7 of a host system-on-chip (SoC) controller 70 for generating a PWM switching control signals used during excitation and sensing phases. As depicted, the controller 70 includes one or more application core or central processing unit (CPU) subsystems 71 and a random access memory 72 connected over an interconnect communication bus or fabric 73 to one or more peripheral subsystems, such as an analog-to-digital converter (ADC) module subsystem 74, a comparator module subsystem 75, a direct memory access (DMA) module subsystem 76, a PWM generator subsystem 77, a trigger unit subsystem 78, and a peripheral driver subsystem 79. As will be appreciated, each SoC subsystem block is bi-directionally connected to the interconnect bus/fabric 73. In addition, the host SoC controller 70 may be implemented as circuitry on a single integrated circuit. In addition, the application core/CPU subsystem(s) 71 may be any type of processing circuit, including but not limited to a microprocessor (MPU), microcontroller (MCU), digital signal processor (DSP), or another type of processor or processor core. In addition, the random access memory 72 may take any suitable form, including but not limited to flash, SRAM (Static Random Access Memory), magnetic memory, or any other suitable type. In addition, the interconnect bus/fabric 73 can be any type of bus structure, including but not limited to an advanced high-performance bus (AHB) or an advanced peripheral bus (APB). In addition, one or more additional peripheral subsystems may be included, such as a peripheral device or special-purpose processors to control peripheral units, communication interfaces, timers, encoders/decoders, etc.

The application core/CPU subsystem 71 exchanges data signal information over the interconnect communication bus or fabric 73 with the peripheral subsystems 74-79 which may perform signal conversion, regulation, bus protocols and any other necessary functions, on any input data signal. For example, the application core/CPU subsystem 71 may use the PWM generator module subsystem 77 to generate one more PWM signals that are provided to the peripheral driver subsystem 79 which generates switching control signals S1-S4 for a peripheral full-bridge converter (not shown), including discharge phase switching control signals, continuous excitation phase switching control signals, and free resonance signal sensing phase switching control signals. While the pulses of the PWM signals may be generated at any suitable rate from one to millions of Hz, the pulses may be generated by the DMA module 76 and PWM generator module 77. In addition, the application core/CPU subsystem 71 may use the ADC module 74 and comparator module 75 to convert an analog input voltage signal into a digital input signal which the application core/CPU subsystem 71 analyzes to calculate a quality factor measure using any suitable algorithm. Once configured, these peripheral subsystems 74-79 operate independently of the application core/CPU subsystem(s) 71 so that pulses are generated continuously without any interaction with the application core/CPU subsystem(s) 71 until processing of an output waveform is required to calculate the Q-factor. After the pulse generation process is started, the application core/CPU subsystem(s) 71 may perform many other functions in between performing the PWM generation functions mentioned herein.

In operation, the application core/CPU subsystem(s) 71 is responsible for processing the input sensor data and for managing and maintaining the tables of PWM values that are stored in the RAM 72. In selected embodiments, the core 71 maintains multiple tables of different PWM values to produce different PWM signals. In selected embodiments, the core 71 modifies the PWM values stored in a table in the RAM 72 based on a data input signal. In other words, the core 71 generates new or modified PWM values and writes these new or modified PWM values into registers in a table of the RAM 72. The stored PWM values are read from the tables of the RAM 72 by the DMA module 76 which controls the provision of the selected values to the PWM generator module 77 independently of the core 71. The DMA module 76 allows the PWM generator module 77 to directly access the PWM values stored in the appropriate table in the RAM 72. The PWM module 77 generates the PWM pulse sequence as selected by the core 71 using the values read from the RAM 72 and written into the PWM generator module 77 by the DMA module 76. The pulse sequence generated by the PWM generator module 77 is provided to the peripheral driver module 79 which feeds the output switching control signals with appropriate electrical characteristics to the power converter depending on the particular implementation. The DMA module 76 may be incorporated into the application core/CPU subsystem 71 or another component of the controller 70. The DMA module 76 attends to the communication between the RAM 72 and the PWM generator module 77, allowing the core 71 to attend to other tasks. In addition, the ADC module 74 and/or comparator module 75 may be incorporated into the application core/CPU subsystem 71 or another component of the controller 70.

Figure 8:
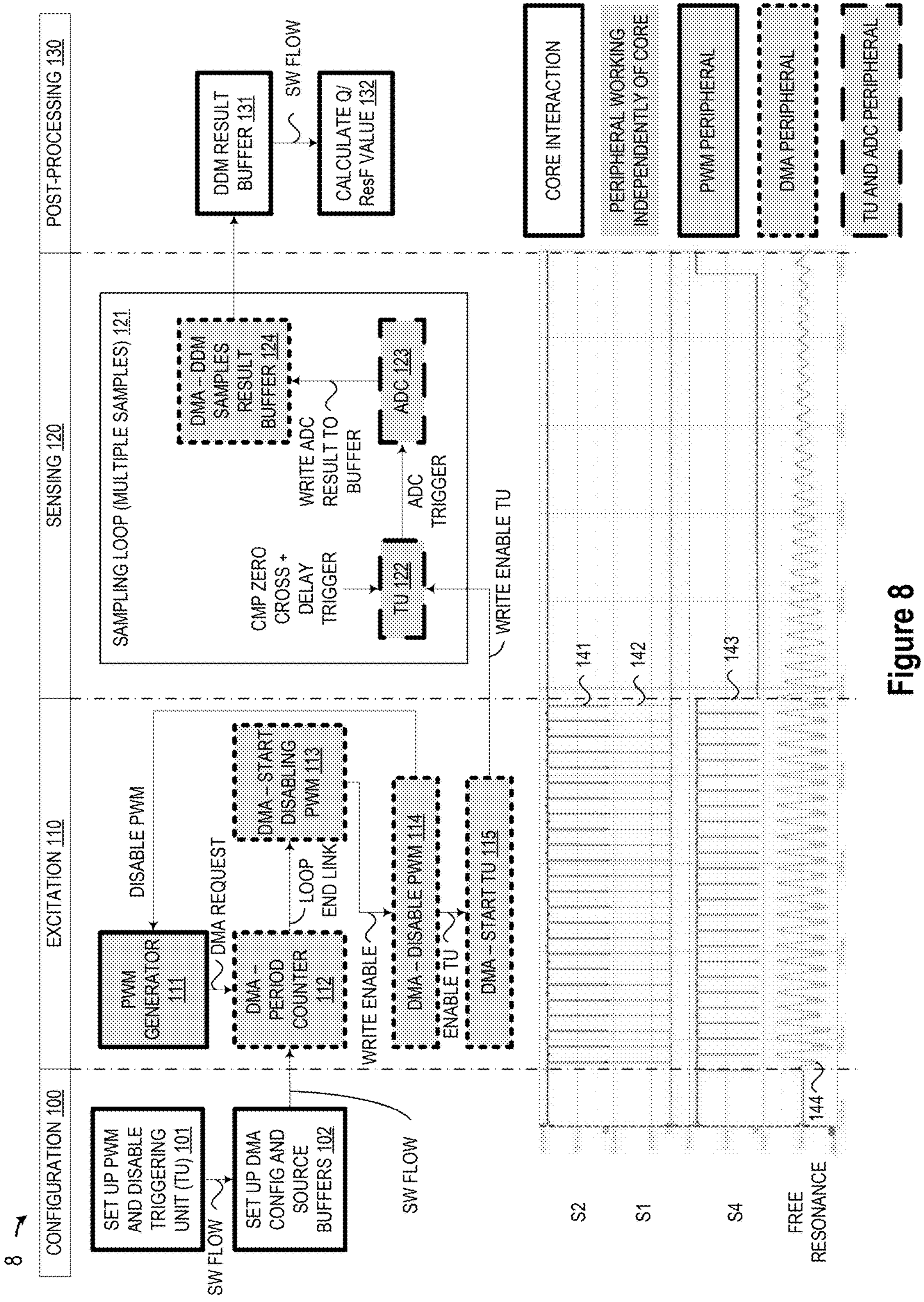
FIG. 8 depicts a simplified block diagram illustrating the roles of core and peripheral components which minimize the core interactions when using a continuous excitation for sensing and calculating a resonance frequency and quality factor in accordance with selected embodiments of the present disclosure.

As will be appreciated, there are controller applications, such as automotive driving applications, where the core is used to perform high priority processing functions. In such applications, there can be interrupts or other demands on the operation of the core that can disrupt the ability of the core to perform other processing operations. To account for the criticality of the core's role in the controller, reference is now made to FIG. 8 which depicts a simplified block diagram 8 illustrating the roles of core and peripheral components which minimize the core interactions when using a continuous excitation for sensing and calculating a resonance frequency and quality factor in accordance with selected embodiments of the present disclosure. As depicted, a software-based solution allocates the roles of the core and peripheral components so that the core component is used for the steps performed during configuration 100 and post-processing 130, but the peripheral components are used for the steps performed during excitation 110 and sensing 120.

In the configuration phase 100, the core is configured with software to prepare for the excitation phase 110 and sensing phase 120. For example, the core sets up the PWM generator and disables the triggering unit (block 101). In the next step of the software flow of configuration phase 100, the core prepares a suitable method of triggering, prepares the transmit buffers for transmit operation, and configures the DMA channels by setting up the DMA and source buffers (block 102). In the configuration phase 100, the switching control signals 141-143 are generated to connect the power inverter output terminals to a supply reference voltage.

In the excitation phase 110, a sequence of peripheral device operations are performed so that the core can disengage with the application. In particular, the peripheral DMA device initiates the period counter (block 112) to specify the (configured) number of periods for the continuous excitation pulse. When the major loop end is reached, another DMA channel is activated via major loop end request, and the peripheral DMA device starts the process for disabling the peripheral PWM generator (block 113) after a specified number of periods for this DMA channel to allow for free resonance measurement. To this end, the peripheral DMA device issues a DMA write enable command to enable the DMA channel, and then the peripheral DMA device issues a "disable PWM" DMA write command to disable the PWM (block 114). In response, the peripheral PWM generator processes the "disable PWM" write command (block 111) to issue a DMA request to the peripheral DMA device. As will be appreciated, the DMA requests from the PWM generator are only used at the start to specify and count number of excitation pulses, but after the peripheral DMA device issues a "disable PWM" command, the requests are dead as they are no longer needed. At each major loop end link, the peripheral DMA device also responds to the DMA write enable by enabling the trigger unit (block 115), such as by issuing a write enable command to the triggering unit (TU) to start the acquisition of the free resonance samples. In the excitation phase 110, the switching control signals 141-143 are generated to have a fixed frequency, where the switching control signals S1, S2 are complementary to one another, and the switching control signal S4 has the same fixed frequency, but with non-overlapping phase-shifted "low" pulses. As a result of the switching control signals 141-143 in the excitation phase 110 being applied to the power inverter, the free resonance signal 143 is generated as an oscillating voltage having the fixed frequency and a uniform voltage range. As will be appreciated, the processing steps 111-115 steps may be mandatory, but there may be additional "in-between" steps required. For example, one peripheral DMA device may start another peripheral DMA device to disable the peripheral PWM generator device in cases where four transfers are required to shut down the peripheral PWM device.

In the sensing phase 120, a sequence of peripheral device operations are performed without core interaction to collect and store samples into a buffer that will be evaluated by the core during postprocessing phase 130 when calculating the frequency or Q-factor measure. In particular, the peripheral TU device receives the write enable TU signal from the peripheral DMA device, and also receives a CMP zero-cross and delay trigger signal. In response, the peripheral TU device (block 122) generates an ADC trigger signal that is provided to the peripheral ADC device. In response to the ADC trigger signal, the peripheral ADC device samples the output power signal (OUT) from the power inverter (block 123), and writes the ADC sampling results to the peripheral DMA device which prepares ADC digital de-demodulation (DDM) samples for DMA storage (block 124). As shown in the sensing phase 120, the peripheral TU, ADC, and DMA devices are connected to perform an iterative sampling loop 121 for collecting multiple ADC samples at the peripheral DMA device. In the sensing phase 120, the switching control signals 141-143 are generated to ground the power inverter (e.g., by turning ON the switching control signal S2 while turning OFF the remaining switching control signals in order to generate the free resonance signal 144.

In the post-processing phase 130, the core is configured with software to receive and store the DDM samples in the DDM result buffer (block 131). In addition, the core calculates the Q-factor value and the resonance frequency (ResF) value (block 132) which are used for foreign object detection. This calculation may also rely on the full-bridge input current and the output power from the coil. As will be appreciated, the post-processing phase 130 may be called any time after the sensing phase 120, since the samples are stored in the DDM result buffer.

As described hereinabove, the roles of the core and peripheral can be architected so that the core is used for limited peripheral configuration operations and post-processing Q-factor calculation processing, and so that the peripheral, non-core devices are used to generate the continuous excitation pulses in the switching control signals that are provided to the power inverter and to collect the digital ADC samples of the free resonant voltage signal in the sensing phase. This architecture is well-suited to being used with software architecture for automotive electronic control units (ECUs), such as the AUTOSAR (AUTomotive Open System ARchitecture) which employs a non-blocking approach to allow a core to disengage with the Q-factor excitation and sensing phases for generating and collecting digital ADC samples of the free resonant voltage signal.

Figure 9:
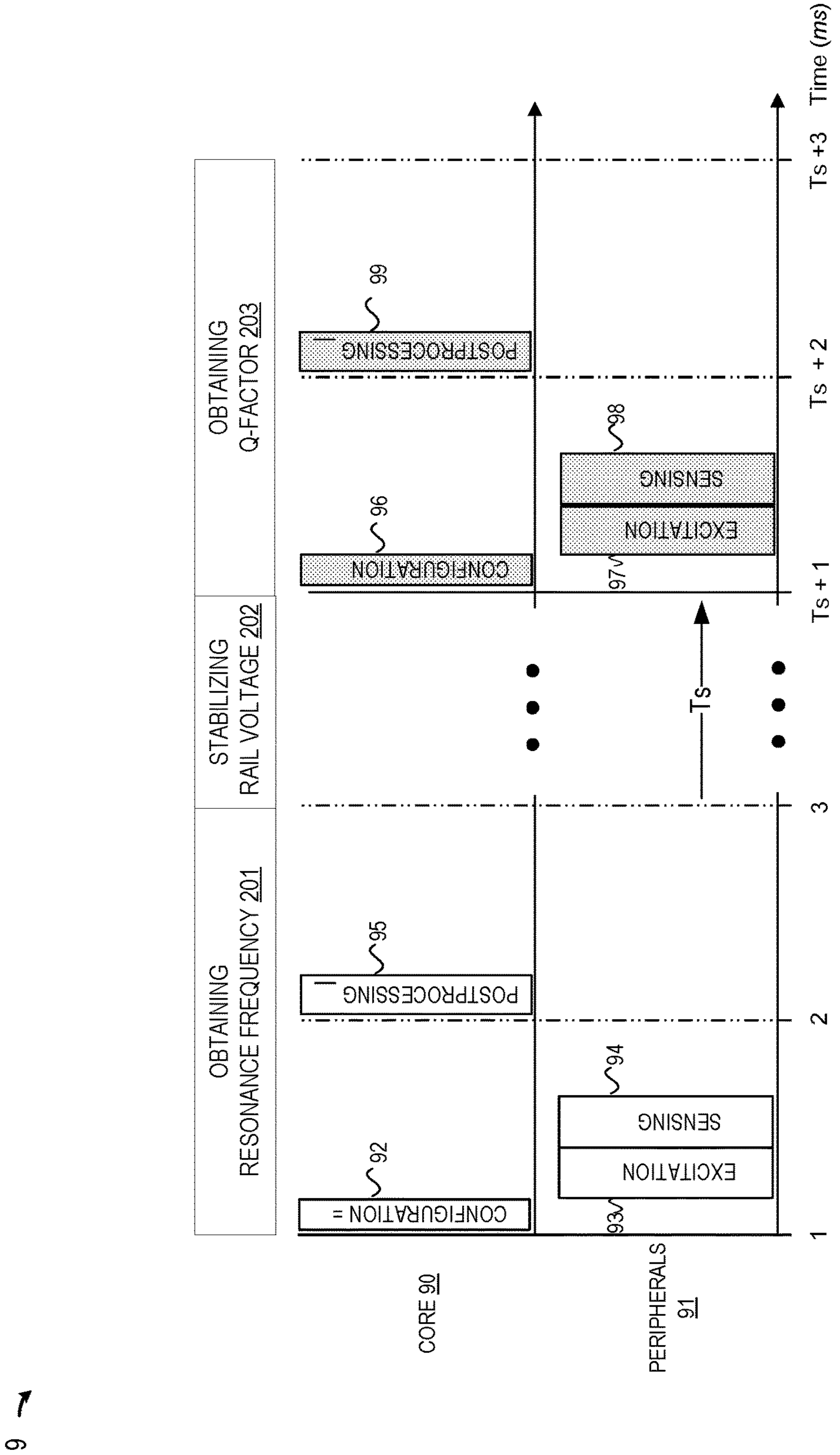
FIG. 9 depicts a simplified timing execution diagram for operating the wireless power charger with a non-blocking approach in accordance with selected embodiments of the present disclosure.

To illustrate the suitability of the disclosed software-based solution for addressing Q-factor measurement instability in automotive hardware, reference is now made to FIG. 9 which depicts a simplified timing execution diagram 9 for operating the wireless power charger with a non-blocking approach in accordance with selected embodiments of the present disclosure. As depicted, the core 90 has a first defined set of processing blocks 92, 95 for performing the task of obtaining the resonance frequency 201, and a second defined set of processing blocks 96, 99 for performing the task of obtaining or calculating the Q-factor 203. In similar fashion, one or more peripherals 91 has a third defined set of non-blocking processing blocks 93, 94 for performing the task of obtaining the resonance frequency 201, and a fourth defined set of non-blocking processing blocks 97, 98 for performing the task of obtaining the Q-factor 203.

As the timing execution diagram 9 shows, the task of obtaining the resonance frequency 201 uses the core 90 for an initial peripheral configuration step 92, and then the core 90 is free to disengage from the task of obtaining the resonance frequency 201. Subsequently, the configured peripheral devices 91 may perform the excitation step 93 which generates the continuous phase-shift excitation pulse sequence in the switching control signals that are applied to the power inverter. And after the excitation step 93, the configured peripheral devices 91 may perform the sensing step 94 which generates the sensing phase switching control signals and measures the free resonance frequency. In selected embodiments, the peripheral devices 91 may include a PWM generator which transfers some DMA counters and data, and may also include a triggering unit for ADC triggering and sampling data into a sample buffer. At a predetermined time (e.g., t=2) during the task of obtaining the resonance frequency 201, the configured peripheral devices 91 have completed their processing steps, and the core 90 is scheduled to perform the postprocessing step 95 for calculating the free resonance frequency. At this point, the core 90 may also issue a request to decrease the rail voltage, such as by issuing an I2C command to the rail voltage controller. As disclosed herein, the release or disengagement of the core 90 between the configuration step 92 and postprocessing step 95 means that the core is available for high priority processing tasks, such as handing, for example, a CAN-FD high priority interrupt request (IRQ) that arrives in the middle of the Q-factor excitation/sampling steps 93, 94.

After performing the task of obtaining the resonance frequency 201, the rail voltages may be stabilized with the rail voltage stabilization task 202. In selected embodiments, the rail voltage controller reduces the rail voltage supplied to the power inverter over a predetermined settling time Ts. As indicated, there is no interaction with the core 90 required during the rail voltage stabilization task 202.

After stabilizing the rail voltage, the task of obtaining the Q-factor 203 uses the core 90 for an initial peripheral configuration step 96, and then the core 90 is free to disengage from the task 203. Subsequently, the configured peripheral devices 91 may perform the excitation step 97 of generating and applying continuous phase-shift excitation pulse sequence in the switching control signals to the power inverter, and may also perform the sensing step 98 of generating the sensing phase switching control signals and measuring the Q-factor. At a predetermined time (e.g., t=Ts+2) during the task of obtaining the Q-factor 203, the configured peripheral devices 91 have completed their processing steps, and the core 90 is scheduled to perform the postprocessing step 99 for calculating the Q-factor value. At this point, the core 90 may also issue a request to return the rail voltage to a default value which can be used for issuing a digital ping voltage request.

With the disclosed non-blocking approach, all of the peripheral devices and the DMA are set during the configuration step or function 92, 96. In addition, the last command in the function configuration step or function 92, 96 may be atomic to run the complete chain of peripheral device functions 93-94, 97-98. After a predetermined period (e.g., after 50-300 μs), the measured Q-factor samples will be in the sample buffer, so the postprocessing step or function 95, 99 (which will be called in Ims) will collect the data from the sample buffer and calculate the Period/Q-factor value.

By now, it should be appreciated that there has been provided a method for measuring a quality factor of a wireless charger having a resonant tank circuit coupled to a multi-switch inverter which is connected to receive a rail voltage and to supply an output pulse width modulation (PWM) signal to the resonant tank circuit in response to switching control signals. As disclosed, the method includes supplying a first set of discharge phase switching control signals to the multi-switch inverter to pull the output PWM signal to a ground reference voltage. In addition, the disclosed method includes supplying a second set of continuous excitation phase switching control signals to the multi-switch inverter to generate the output PWM signal to have alternating positive and negative pulses having a first pulse frequency, where each continuous excitation phase switching control signal includes a plurality of positive or negative excitation pulses having the first pulse frequency. In selected embodiments, each of the second set of continuous excitation phase switching control signals has a duty cycle of between 2-10 percent. The disclosed method also includes supplying a third set of free resonance signal sensing phase switching control signals to the multi-switch inverter to enable the resonant tank circuit to generate a resonant decaying output voltage signal in the presence of a foreign object that is located near the wireless charger. In addition, the disclosed method includes measuring one or more quality factor parameters of the wireless charger based on one or more electrical parameters of the resonant decaying output voltage signal. In selected embodiments, the wireless charger includes a plurality of peripheral devices that are configured by one or more processing cores to perform the steps of supplying the first set of discharge phase switching control signals, the second set of continuous excitation phase switching control signals, and the third set of free resonance signal sensing phase switching control signals. In such embodiments, the one or more processing cores may be configured to perform the step of measuring the one or more quality factor parameters of the wireless charger based on one or more electrical parameters of the resonant decaying output voltage signal, but the one or more processing cores do not interact with the plurality of peripheral devices when the plurality of peripheral devices perform the steps of supplying the first set of discharge phase switching control signals, the second set of continuous excitation phase switching control signals, and the third set of free resonance signal sensing phase switching control signals. In other such embodiments, the plurality of peripheral devices may include a peripheral direct memory access (DMA) device, a peripheral analog-to-digital converter (ADC) device, and a peripheral pulse width modulation (PWM) signal generator device which are connected and configured to measure the one or more quality factor parameters of the wireless charger. In selected embodiments, the disclosed method also includes decreasing the rail voltage to a predetermined reduced rail voltage after measuring one or more quality factor parameters. In such embodiments, the disclosed method may also include, after decreasing the rail voltage to the predetermined reduced rail voltage, the steps of supplying a fourth set of discharge phase switching control signals to the multi-switch inverter to pull the output PWM signal to a ground reference voltage; supplying a fifth set of continuous excitation phase switching control signals to the multi-switch inverter to generate the output PWM signal to have alternating positive and negative pulses having a second pulse frequency, where each continuous excitation phase switching control signal includes a plurality of positive or negative excitation pulses having the second pulse frequency; supplying a sixth set of free resonance signal sensing phase switching control signals to the multi-switch inverter to enable the resonant tank circuit to generate a free resonance voltage signal in the presence of a foreign object that is located near the wireless charger; and measuring a quality factor of the wireless charger based on one or more electrical parameters of the free resonance voltage signal. In selected embodiments, the second set of continuous excitation phase switching control signals may include a first continuous excitation phase switching control signal having a plurality of positive excitation pulses that is provided to gate a first power FET switch in a first branch of the multi-switch inverter; a second continuous excitation phase switching control signal having a plurality of negative excitation pulses that is provided to gate a second power FET switch in the first branch of the multi-switch inverter; a third continuous excitation phase switching control signal having a plurality of positive, phase-shifted excitation pulses that is provided to gate a third power FET switch in a second branch of the multi-switch inverter; and a fourth continuous excitation phase switching control signal having a plurality of negative phase shifted excitation pulses that is provided to gate a fourth power FET switch in the second branch of the multi-switch inverter, where the first and second branches of the multi-switch inverter are connected in parallel between first and second supply voltages.

In another form, there has been provided a wireless power transmitter and associated method for measuring a quality factor of the wireless power transmitter. As disclosed, the wireless power transmitter includes a controller core connected and configured to generate a plurality of switching control signals. In addition, the wireless power transmitter includes a multi-switch inverter coupled to the controller core for generating an output pulse width modulation (PWM) signal in response to the plurality of switching control signals. The wireless power transmitter also includes a resonant tank circuit coupled to receive the output PWM signal and to generate a transmitter resonance circuit voltage or current signal that is applied to a transmitter coil. The switching control signals include a first set of discharge phase switching control signals to pull the output PWM signal to a ground reference voltage during a discharge phase. In addition, the switching control signals include a second set of continuous excitation phase switching control signals to generate the output PWM signal to have alternating positive and negative pulses having a first pulse frequency during an excitation phase, where each continuous excitation phase switching control signal includes a plurality of positive or negative excitation pulses having the first pulse frequency. In selected embodiments, each of the second set of continuous excitation phase switching control signals has a duty cycle of between 2-10 percent. The switching control signals also include a third set of free resonance signal sensing phase switching control signals to enable the resonant tank circuit to generate a resonant decaying output voltage signal during a foreign object sensing phase. In addition, the disclosed controller core is configured to measure one or more quality factor parameters of the wireless power transmitter based on one or more electrical parameters of the transmitter resonance circuit voltage or current signal that are measured during the foreign object sensing phase. In selected embodiments, the wireless power transmitter also includes a plurality of peripheral devices that are connected to generate the first set of discharge phase switching control signals, the second set of continuous excitation phase switching control signals, and the third set of free resonance signal sensing phase switching control signals. In such embodiments, the controller core may configure the peripheral devices and measure the quality factor parameters, but is not otherwise involved with generating the first set of discharge phase switching control signals, the second set of continuous excitation phase switching control signals, and the third set of free resonance signal sensing phase switching control signals. In selected embodiments, the peripheral devices include a peripheral direct memory access (DMA) device, a peripheral analog-to-digital converter (ADC) device, and a peripheral pulse width modulation (PWM) signal generator device which are connected and configured to measure the one or more quality factor parameters of the wireless power transmitter. In selected embodiments, the wireless power transmitter may also include a rail voltage supply connected to provide an adjustable rail voltage to the multi-switch inverter, where the rail voltage is reduced to a reduced rail voltage after measuring the one or more quality factor parameters. In selected embodiments, the multi-switch inverter may include first and second branches connected in parallel between first and second supply voltages. As disclosed, the first branch includes a first power FET switch that is connected to receive a first continuous excitation phase switching control signal having a plurality of positive excitation pulses, and also includes a series-connected second power FET switch that is connected to receive a second continuous excitation phase switching control signal having a plurality of negative excitation pulses. In addition, the disclosed second branch includes a third power FET switch that is connected to receive a third continuous excitation phase switching control signal having a plurality of positive, phase-shifted excitation pulses, and also includes a fourth power FET switch that is connected to receive a fourth continuous excitation phase switching control signal having a plurality of negative phase shifted excitation pulses. In selected embodiments, the controller core may be configured to generate a first plurality of switching control signals having a first fixed frequency and a second plurality of switching control signals having a second different frequency. The generated first plurality of switching control signals is provided to the multi-switch inverter during a free resonant frequency measurement phase which measures a free resonant frequency value for the wireless power transmitter. In addition, the generated second plurality of switching control signals is provided to the multi-switch inverter during a quality factor measurement phase which measures the quality factor of the wireless power transmitter, where the second different frequency of the second plurality of switching control signals is set to the free resonant frequency value.

In yet another form, there is provided a system, method, apparatus for measuring a quality factor of a wireless power transmitter having a controller core, a full-bridge power converter, and a resonant tank circuit connected to a transmitter coil located on a charging surface. In the disclosed system, the controller core is configured to supply a first set of switching control signals to the full-bridge power converter during a free resonant frequency measurement phase when the controller core measures a free resonant frequency value for the wireless power transmitter, where the first set of switching control signals include a first set of continuous excitation phase switching control signals having a plurality of excitation pulses having a first pulse frequency. In the disclosed system, the controller core is also configured to supply a second set of switching control signals to the full-bridge power converter during a quality factor measurement phase when the controller core measures a quality factor for the wireless power transmitter, where the second set of switching control signals includes a second set of continuous excitation phase switching control signals having a plurality of excitation pulses having a second pulse frequency that is equal to the free resonant frequency value. In selected embodiments, the disclosed system may also include a rail voltage supply connected to provide an adjustable rail voltage to the full-bridge power converter, where the rail voltage is reduced to a reduced rail voltage after the free resonant frequency measurement phase and before the quality factor measurement phase. In selected embodiments of the disclosed system, the first set of switching control signals may also include (1) a set of discharge phase switching control signals supplied to the full-bridge power converter during the free resonant frequency measurement phase to ground an output voltage signal from the full-bridge power converter before supplying the first set of continuous excitation phase switching control signals to the full-bridge power converter, and (2) a set of sensing phase switching control signals supplied to the full-bridge power converter during the free resonant frequency measurement phase to enable the resonant tank circuit to generate a first resonant decaying output voltage signal after supplying the first set of continuous excitation phase switching control signals to the full-bridge power converter. In such embodiments of the disclosed system, the second set of switching control signals may also include (1) a set of discharge phase switching control signals supplied to the full-bridge power converter during the quality factor measurement phase to ground an output voltage signal from the full-bridge power converter before supplying the second set of continuous excitation phase switching control signals to the full-bridge power converter, and (2) a set of sensing phase switching control signals supplied to the full-bridge power converter during the quality factor measurement phase to enable the resonant tank circuit to generate a second resonant decaying output voltage signal after supplying the second set of continuous excitation phase switching control signals to the full-bridge power converter.

Although the described exemplary embodiments disclosed herein are directed to selected wireless power charging circuits and methods of operation for using a predetermined excitation pulse sequence to drive a resonance circuit before performing free resonance decay signal sensing and Q-factor measurements, the present invention is not necessarily limited to the example embodiments which illustrate inventive aspects of the present invention that are applicable to a wide variety of circuit configurations. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

The described examples may be implemented on a single integrated circuit, for example in software in a digital signal processor (DSP) as part of an electronic control unit (ECU). Alternatively, the circuit and/or component examples may be implemented as any number of separate integrated circuits or separate devices interconnected with each other in a suitable manner. These examples may alternatively be implemented as soft or code representations of physical circuitry or of logical representations convertible into physical circuitry, such as in a hardware description language of any appropriate type.

Boundaries between the above-described operations are provided as examples. Multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer-useable storage medium for execution by a computer. As an example, an embodiment of a computer program product includes a computer-useable storage medium to store a computer readable program.

Alternatively, embodiments of the invention may be implemented entirely in hardware or in an implementation containing both hardware and software elements. In embodiments which use software, the software may include but is not limited to firmware, resident software, microcode, etc.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for measuring a quality factor of a wireless charger comprising a resonant tank circuit coupled to a multi-switch inverter which is connected to receive a rail voltage and to supply an output pulse width modulation (PWM) signal to the resonant tank circuit in response to switching control signals, the method comprising:

supplying a first set of discharge phase switching control signals to the multi-switch inverter to pull the output PWM signal to a ground reference voltage;

supplying a second set of continuous excitation phase switching control signals to the multi-switch inverter to generate the output PWM signal to have alternating positive and negative pulses having a first pulse frequency, where each continuous excitation phase switching control signal includes a plurality of positive or negative excitation pulses having the first pulse frequency;

supplying a third set of free resonance signal sensing phase switching control signals to the multi-switch inverter to enable the resonant tank circuit to generate a resonant decaying output voltage signal in the presence of a foreign object that is located near the wireless charger; and measuring one or more quality factor parameters of the wireless charger based on one or more electrical parameters of the resonant decaying output voltage signal;

wherein the second set of continuous excitation phase switching control signals are applied for a duration sufficient to establish a steady-state oscillation of the resonant tank circuit which eliminates transients and then to measure a free resonance frequency of the resonant tank circuit; and wherein the sensing phase switching control signals are supplied based on the measured free resonance frequency of the resonant tank circuit.

2. The method of claim 1, where the wireless charger comprises a plurality of peripheral devices that are configured by one or more processing cores to perform the steps of supplying the first set of discharge phase switching control signals, the second set of continuous excitation phase switching control signals, and the third set of free resonance signal sensing phase switching control signals.

3. The method of claim 2, where the one or more processing cores are configured to perform the step of measuring the one or more quality factor parameters of the wireless charger based on one or more electrical parameters of the resonant decaying output voltage signal, but the one or more processing cores do not interact with the plurality of peripheral devices when the plurality of peripheral devices performs the steps of supplying the first set of discharge phase switching control signals, the second set of continuous excitation phase switching control signals, and the third set of free resonance signal sensing phase switching control signals.

4. The method of claim 2, where the plurality of peripheral devices comprises a peripheral direct memory access (DMA) device, a peripheral analog-to-digital converter (ADC) device, and a peripheral pulse width modulation (PWM) signal generator device which are connected and configured to measure the one or more quality factor parameters of the wireless charger.

5. The method of claim 1, further comprising decreasing the rail voltage to a predetermined reduced rail voltage after measuring one or more quality factor parameters.

6. The method of claim 1, further comprising:

supplying a fourth set of discharge phase switching control signals to the multi-switch inverter to pull the output PWM signal to a ground reference voltage;

supplying a fifth set of continuous excitation phase switching control signals to the multi-switch inverter to generate the output PWM signal to have alternating positive and negative pulses having a second pulse frequency, where each continuous excitation phase switching control signal includes a plurality of positive or negative excitation pulses having the second pulse frequency;

supplying a sixth set of free resonance signal sensing phase switching control signals to the multi-switch inverter to enable the resonant tank circuit to generate a free resonance voltage signal in the presence of a foreign object that is located near the wireless charger; and measuring a quality factor of the wireless charger based on one or more electrical parameters of the free resonance voltage signal.

7. The method of claim 1, where the second set of continuous excitation phase switching control signals comprises:

a first continuous excitation phase switching control signal having a plurality of positive excitation pulses that is provided to gate a first power FET switch in a first branch of the multi-switch inverter;

a second continuous excitation phase switching control signal having a plurality of negative excitation pulses that is provided to gate a second power FET switch in the first branch of the multi-switch inverter;

a third continuous excitation phase switching control signal having a plurality of positive, phase-shifted excitation pulses that is provided to gate a third power FET switch in a second branch of the multi-switch inverter; and a fourth continuous excitation phase switching control signal having a plurality of negative phase shifted excitation pulses that is provided to gate a fourth power FET switch in the second branch of the multi-switch inverter, where the first and second branches of the multi-switch inverter are connected in parallel between first and second supply voltages.

8. The method of claim 1, where each of the second set of continuous excitation phase switching control signals has a duty cycle of between 2-10 percent.

9. A wireless power transmitter, comprising:

a controller core connected and configured to generate a plurality of switching control signals;

a multi-switch inverter coupled to the controller core for generating an output pulse width modulation (PWM) signal in response to the plurality of switching control signals; and a resonant tank circuit coupled to receive the output PWM signal and to generate a transmitter resonance circuit voltage or current signal that is applied to a transmitter coil;

where the plurality of switching control signals comprises:

a first set of discharge phase switching control signals to pull the output PWM signal to a ground reference voltage during a discharge phase;

a second set of continuous excitation phase switching control signals to generate the output PWM signal to have alternating positive and negative pulses having a first pulse frequency during an excitation phase, where each continuous excitation phase switching control signal includes a plurality of positive or negative excitation pulses having the first pulse frequency; and a third set of free resonance signal sensing phase switching control signals to enable the resonant tank circuit to generate a resonant decaying output voltage signal during a foreign object sensing phase, and where the controller core is configured to measure one or more quality factor parameters of the wireless power transmitter based on one or more electrical parameters of the transmitter resonance circuit voltage or current signal that are measured during the foreign object sensing phase; and wherein the second set of continuous excitation phase switching control signals are applied for a duration sufficient to establish a steady-state oscillation of the resonant tank circuit which eliminates transients and then to measure a free resonance frequency of the resonant tank circuit; and wherein the sensing phase switching control signals are supplied based on the measured free resonance frequency of the resonant tank circuit.

10. The wireless power transmitter of claim 9, where each of the second set of continuous excitation phase switching control signals has a duty cycle of between 2-10 percent.

11. The wireless power transmitter of claim 9, further comprising a plurality of peripheral devices that are connected to generate the first set of discharge phase switching control signals, the second set of continuous excitation phase switching control signals, and the third set of free resonance signal sensing phase switching control signals.

12. The wireless power transmitter of claim 11, where the controller core configures the plurality of peripheral devices and measures the one or more quality factor parameters, but is not otherwise involved with generating the first set of discharge phase switching control signals, the second set of continuous excitation phase switching control signals, and the third set of free resonance signal sensing phase switching control signals.

13. The wireless power transmitter of claim 11, where the plurality of peripheral devices comprises a peripheral direct memory access (DMA) device, a peripheral analog-to-digital converter (ADC) device, and a peripheral pulse width modulation (PWM) signal generator device which are connected and configured to measure the one or more quality factor parameters of the wireless power transmitter.

14. The wireless power transmitter of claim 9, further comprising a rail voltage supply connected to provide an adjustable rail voltage to the multi-switch inverter, where the rail voltage is reduced to a reduced rail voltage after measuring the one or more quality factor parameters.

15. The wireless power transmitter of claim 9, where the multi-switch inverter comprises first and second branches connected in parallel between first and second supply voltages, wherein:

a first power FET switch in the first branch is connected to receive a first continuous excitation phase switching control signal having a plurality of positive excitation pulses;

a second power FET switch in the first branch is connected to receive a second continuous excitation phase switching control signal having a plurality of negative excitation pulses;

a third power FET switch in the second branch is connected to receive a third continuous excitation phase switching control signal having a plurality of positive, phase-shifted excitation pulses; and a fourth power FET switch in the second branch is connected to receive a fourth continuous excitation phase switching control signal having a plurality of negative phase shifted excitation pulses.

16. The wireless power transmitter of claim 9, where the controller core is configured to generate a first plurality of switching control signals having a first fixed frequency and a second plurality of switching control signals having a second different frequency;

where the first plurality of switching control signals is provided to the multi-switch inverter during a free resonant frequency measurement phase which measures a free resonant frequency value for the wireless power transmitter;

where the second plurality of switching control signals is provided to the multi-switch inverter during a quality factor measurement phase which measures the quality factor of the wireless power transmitter; and where the second different frequency of the second plurality of switching control signals is set to the free resonant frequency value.

* * * * *